United States Patent
Keeth

(10) Patent No.: US 6,442,084 B2
(45) Date of Patent: Aug. 27, 2002

(54) SEMICONDUCTOR MEMORY HAVING SEGMENTED ROW REPAIR

(75) Inventor: Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/928,404

(22) Filed: Aug. 14, 2001

Related U.S. Application Data

(63) Continuation of application No. 09/594,442, filed on Jun. 14, 2000, now Pat. No. 6,314,030.

(51) Int. Cl.$^7$ .................................................. G11C 7/00
(52) U.S. Cl. .................. 365/200; 365/210; 365/189.07
(58) Field of Search ............................. 365/200, 210, 365/230.03, 230.04, 230.06, 189.07, 230.08, 189.03

(56) References Cited

U.S. PATENT DOCUMENTS

| | | | |
|---|---|---|---|
| 4,918,622 A | | 4/1990 | Kondo |
| 5,355,339 A | | 10/1994 | Oh et al. |
| 5,457,655 A | * | 10/1995 | Savignac et al. ........... 365/200 |
| 5,528,539 A | | 6/1996 | Ong et al. |
| 5,652,725 A | | 7/1997 | Suma et al. |
| 5,706,292 A | | 1/1998 | Meritt |
| 5,732,030 A | * | 3/1998 | Dorney ........................ 365/200 |
| 5,815,447 A | | 9/1998 | Thomann |
| 5,889,710 A | | 3/1999 | Pasucci |
| 6,005,813 A | | 12/1999 | Waller et al. |
| 6,011,735 A | | 1/2000 | Doishi et al. |
| 6,163,489 A | * | 12/2000 | Blodgett ...................... 365/200 |

* cited by examiner

Primary Examiner—Hoai Ho
Assistant Examiner—Thong Le
(74) Attorney, Agent, or Firm—Dickstein Shapiro Morin & Oshinsky LLP

(57) ABSTRACT

A memory device having a segment row repair architecture that provides the benefits of single bit repair, thereby efficiently utilizing redundant rows of the memory device, is disclosed. The rows of a memory device are segmented into four segments and segmented row repair is provided by selectively disabling a wordline driver for only one segment of the primary row in which a defective memory cell is located and enabling a redundant wordline driver with a redundant term signal provided by the redundancy matching circuit, thereby substituting a redundant row segment for only a specific segment of the entire row length. By selectively disabling only the wordline driver associated with the defective memory cell and dividing the primary and redundant rows into four segments, localized or single bit repair can be performed, thereby efficiently utilizing the redundant rows of the memory device.

27 Claims, 7 Drawing Sheets

US 6,442,084 B2

1

SEMICONDUCTOR MEMORY HAVING SEGMENTED ROW REPAIR

This application is a continuation of application Ser. No. 09/594,442 filed on Jun. 14, 2000, now U.S. Pat. No. 6,134,030 which is hereby incorporated by reference.

BACKGROUND OF THE INVENTION

1. Field of the Invention

The present invention relates generally to integrated circuit memory devices, and more particularly to a memory device having segmented row repair.

2. Description of the Related Art

Memory tests on semiconductor devices, such as random access memory (RAM) integrated circuits, e.g., DRAMs, SRAMs and the like, are typically performed by the manufacturer during production and fabrication to locate defects and failures in such devices that can occur during the manufacturing process of the semiconductor devices. Defects may be caused by a number of factors, including particle defects such as broken or shorted out columns and rows, particle contamination, or bit defects. The testing is typically performed by a memory controller or processor (or a designated processor in a multi-processor machine) which runs a testing program, often before a die containing the semiconductor device is packaged into a chip.

Random access memories are usually subjected to data retention tests and/or data march tests. In data retention tests, every cell of the memory is written and checked after a pre-specified interval to determine if leakage current has occurred that has affected the stored logic state. In a march test, a sequence of read and/or write operations is applied to each cell, either in increasing or decreasing address order. Such testing ensures that hidden defects will not be first discovered during operational use, thereby rendering end-products unreliable.

Many semiconductor devices, particularly memory devices, include redundant circuitry on the semiconductor device that can be employed to replace malfunctioning circuits found during testing. During the initial testing of a memory device, defective elements are repaired by replacing them with non-defective elements referred to as redundant elements. By enabling such redundant circuitry, the device need not be discarded even if it fails a particular test.

FIG. 1 illustrates in block diagram form a 256 Mbit DRAM 20. DRAM 20 includes eight memory banks or arrays 22a–22h, labeled BANK<0> to BANK<7>. Each memory bank 22a–h is a 32 Mbit array map 24 as illustrated in FIG. 2. The architecture of array map 24 illustrated in FIG. 2 divides array map 24 into a plurality of 256K blocks 30 (only one labeled for clarity). As shown, array map 24 includes eight vertical strips 26a–26h of the 256K blocks 30 across, labeled DQ<0> to DQ<7>, and is sixteen strips of the 256K blocks 30 high. Memory cells (not shown) in each 256K block 30 are arranged in a plurality of primary rows and redundant rows. For example, typically 512 primary rows and 4 redundant rows are provided. Sense amplifiers 32 are provided between each row of 256K blocks 30 for sensing data stored in the memory cells therein. Wordline drivers 34 are provided on each side of each vertical strip of 256K blocks 30 for firing a wordline in each 256K block 30 associated with a specified row address. Accordingly, there will be an associated wordline and wordline driver for each row of memory cells in a 256K block 30. Thus, it should be understood that wordline driver 34 actually comprises a plurality of wordline drivers, one for each wordline.

Within each 256K block 30, the rows are designated as either an even row or an odd row. Accordingly, each wordline driver 34 will fire either a wordline associated with an odd row or an even row. FIG. 3 illustrates a single horizontal strip of 256K blocks 30 from FIG. 2. Wordline drivers 34a, 34c, 34e, 34g and 34i will fire even row wordlines, while drivers 34b, 34d, 34f and 34h will fire odd row wordlines. Thus, wordline driver 34a will fire even rows 40 in block 26a, wordline driver 34c will fire even rows 40 in blocks 26b and 26c, wordline driver 34e will fire even rows 40 in blocks 26d and 26e, wordline driver 34g will fire even rows 40 in blocks 26f and 26g, and wordline driver 34i will fire even rows 40 in block 26h. Conversely, wordline driver 34b will fire odd rows 42 in blocks 26a and 26b, wordline driver 34d will fire odd rows 42 in blocks 26c and 26d, wordline driver 34f will fire odd rows 42 in blocks 26e and 26f, and wordline driver 34h will fire odd rows 42 in blocks 26g and 26h.

A memory cell is accessed by applying a specific row address to the wordline drivers 34. A local wordline driver is driven by application of the address and a phase term provided from a global wordline driver (not shown) to activate the selected cell row via one of the row lines, while a column decoder (not shown) will activate the column select circuits to access specified memory cells on an open row. Accordingly, the selected row will be activated across all eight vertical strips 26a–26h.

As noted above, memory devices typically employ redundant rows and columns of memory cells so that if a memory cell in a column or row of the primary memory array is defective, then an entire column or row of redundant memory cells can be substituted therefore. Substitution of one or more of the spare rows or columns is conventionally accomplished by opening a specific combination of fuses (not shown) or closing antifuses in one of several fuse banks (not shown) on the die. A selected combination of fuses are blown to provide an address equal to the address of the defective cell. For example, if the defective cell has an eight-bit binary address of 11011011, then the third and sixth fuses in a set of eight fuses within one of several fuse banks will be blown, thereby storing this address. A compare circuit (not shown) compares each incoming address to the blown fuse addresses stored in the fuse banks to determine whether the incoming address matches with one of the blown fuse addresses. If the compare circuit determines a match, then it outputs a match signal (typically one bit). In response thereto, the wordline drivers 34 of a redundant row will be activated to access the redundant row in substitution for the row with the defective memory cell.

There are drawbacks, however, with the redundant row substitution approach described above. The redundant rows of memory cells necessarily occupy space on the die. Therefore, it is desirable to obtain the maximum number of repairs using a minimum number of spare rows by utilizing a single bit repair method. This is not possible, however, when a complete redundant row must be substituted for a primary row that has only a single defective memory cell, as a substantial amount of non-defective memory cells will also necessarily be replaced by the example, if vertical strip 26d of FIG. 3 has a defective memory cell, when a redundant row is used to replace the row in which the defective memory cell is located, the entire redundant row will be utilized across all strips 26a–26h, even though there may be no defects in the corresponding row in the other seven strips 26a–26c and 26e–26h.

Thus, there exists a need for a memory device in which efficient use of a redundant circuit to replace a defective primary circuit is provided, thereby minimizing die space required for the redundant circuit.

SUMMARY OF THE INVENTION

The present invention overcomes the problems associated with the prior art and provides a memory device having a segmented row repair architecture that provides the benefits of localized or single bit repair, thereby efficiently utilizing redundant rows of the memory device.

In accordance with the present invention, the rows of a memory bank are segmented into four segments and segmented row repair is provided by selectively disabling a wordline driver for only one segment in which a defective memory cell is located and enabling a redundant wordline driver with a redundant term signal provided by the redundancy matching circuit, thereby selecting a redundant row segment for only a specific portion of the entire row length. By selectively disabling only the wordline driver associated with the defective memory cell and dividing the primary and redundant rows into four segments, localized or single bit repair can be performed, thereby efficiently utilizing the redundant rows of the memory device.

These and other advantages and features of the invention will become more readily apparent from the following detailed description of the invention which is provided in connection with the accompanying drawings.

DETAILED DESCRIPTION OF THE PREFERRED EMBODIMENTS

Figure 1:
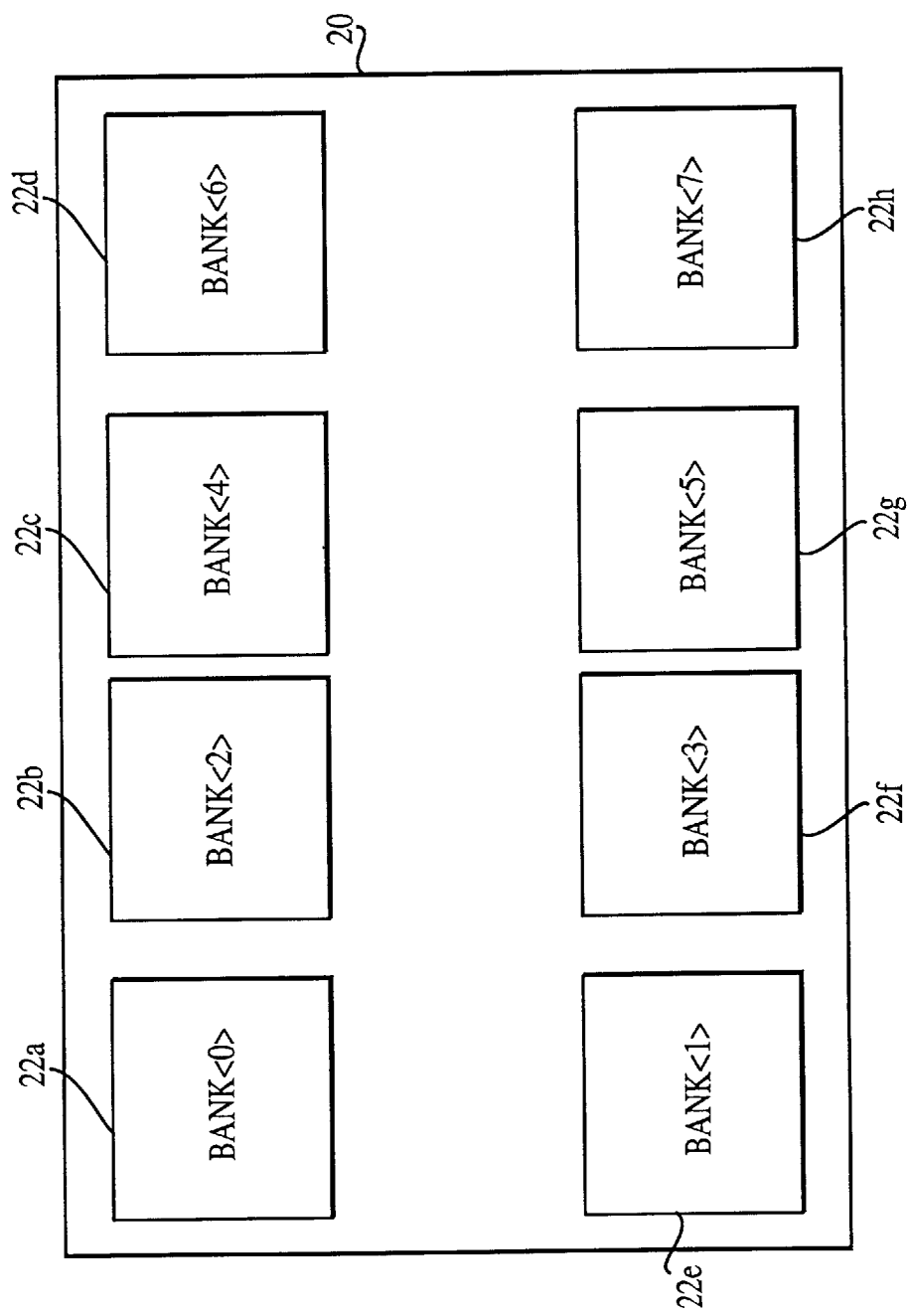
FIG. 1 illustrates in block diagram form a conventional memory device.

The present invention will be described as set forth in the preferred embodiments illustrated in FIGS. 4–7. Other embodiments may be utilized and structural or logical changes may be made without departing from the spirit or scope of the present invention. Like items are referred to by like reference numerals.

In accordance with the present invention, segmented row repair is provided by selectively disabling a wordline driver for a row segment containing a defective memory cell and enabling a redundant wordline driver for a redundant row segment with a redundant term signal provided by the redundancy matching circuit, thereby substituting a redundant row segment for only a specific segment of the entire row length which contains a defective memory cell.

Figure 4:
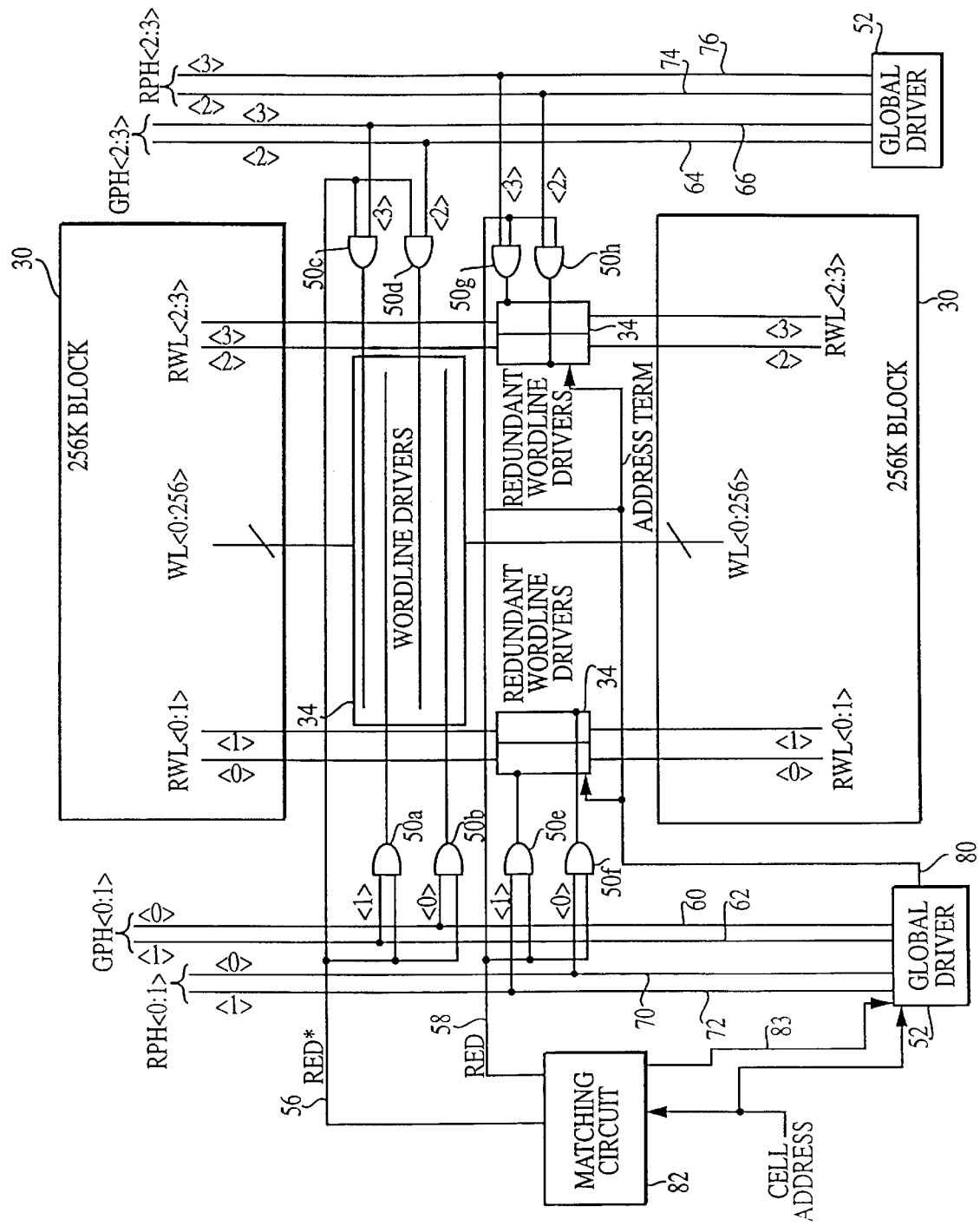
FIG. 4 illustrates a portion of a memory device in accordance with the present invention.

FIG. 4 illustrates a portion of a memory device having segmented row repair in accordance with the present invention. Specifically, FIG. 4 illustrates the area between two vertical strips of the 256K blocks 30 where the wordline drivers 34 are located. In accordance with the present invention, the wordline drivers 34 for the segment of the row that includes a defective memory cell can be disabled, and one of the redundant wordline drivers 34 enabled, to replace the defective memory cell, as will be described further below.

A global wordline driver 52 activates a desired row by providing an address term and four phase signals, as is known in the art. The use of the four phase signals reduces the number of address terms required for each 256K block 30. Thus, for example, if there are 512 rows in the 256K block 30, the number of address terms can be reduced to 128 by using the four phase signals (128×4=512). The four phase signals are global phase signal (GPH) <0>60, GPH<1>62, GPH<2>64 and GPH<3>66. Similar phase signals are also provided to activate the redundant row included in each 256K block 30. Specifically, the signals for the redundant rows include redundant phase signal(RPH)<0>70, RPH<1>72, RPH<2>74 and RPH<3>76. In accordance with the present invention, a plurality of AND gates 50a–50h are provided. A first input of each AND gate 50a–50d is connected to one of the four global phase (GPH) signals 60–66 from the global driver 52, and a first input of each AND gate 50e–50h is connected to one of the four redundant phase (RPH) signals 70–76. Specifically, AND gate 50a has a first input connected to the signal GPH<1>62, AND gate 50b has a first input connected to the signal GPH<0>60, AND gate 50c has a first input connected to the signal GPH<3> 66, AND gate 50d has a first input connected to the signal GPH<2>64, AND gate 50e has a first input connected to the signal RPH<1>72, AND gate 50f has a first input connected to the signal RPH<0>70, AND gate 50g has a first input connected to the signal RPH<3> 76, and AND gate 50h has a first input connected to the signal RPH<2>74. The output from each AND gate 50a–50d is connected to the wordline drivers 34 for the primary rows of 256K blocks 30, while the output from each AND gate 50e–50h is connected to a redundant wordline drive 34 for the redundant rows of 256K blocks 30. Thus, the output from the AND gates 50a–50h, in conjunction with the address terms from global driver 52 on bus line 80, will drive the desired wordline driver 34 or redundant wordline driver 34 to activate a selected primary row (labeled WL<0:256>) or a redundant row (labeled RWL<0:1> and RVVL<2:3>) in the 256K blocks 30.

Figure 2:
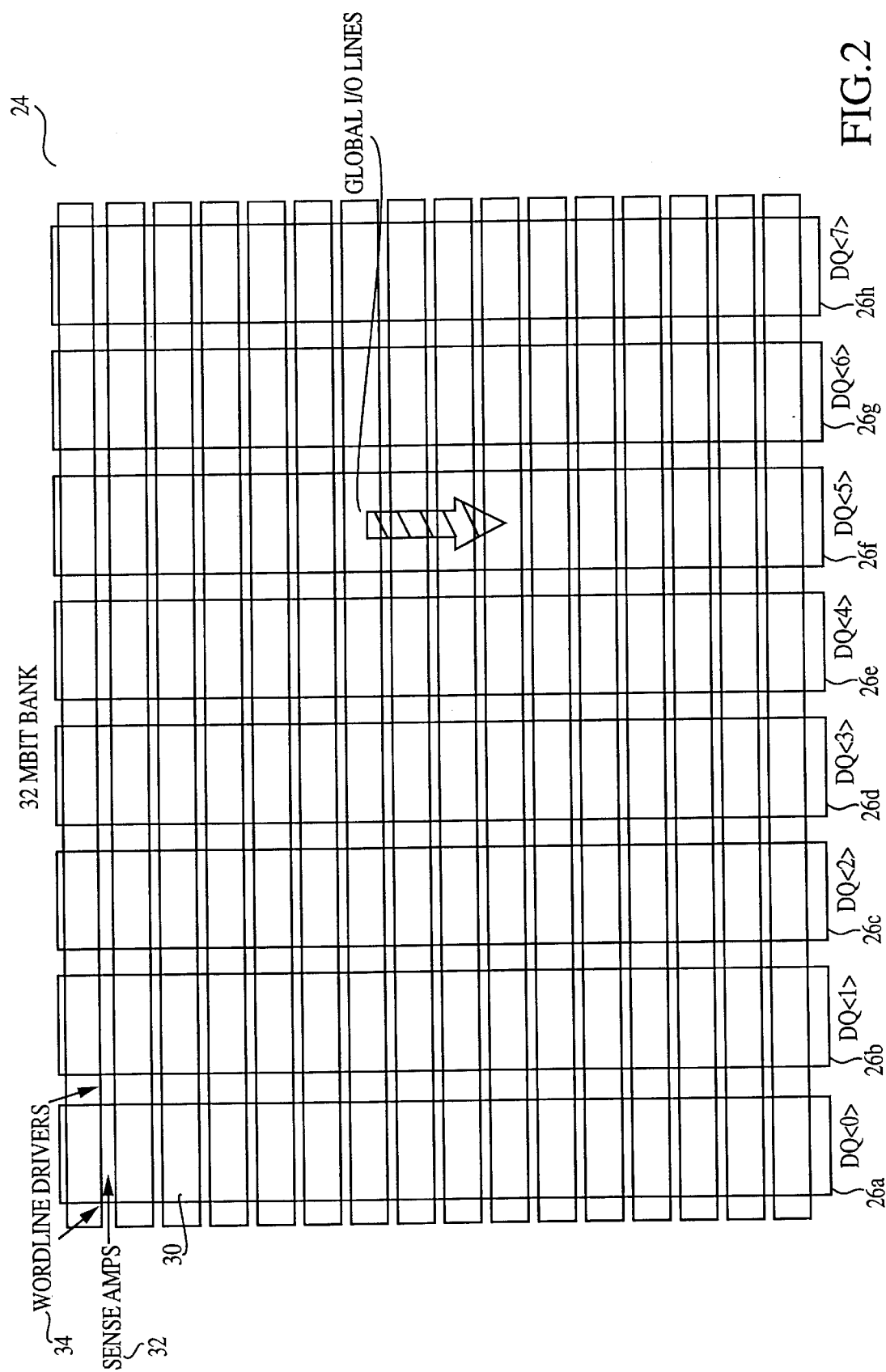
FIG. 2 illustrates one bank of the memory device of FIG. 1.
Figure 3:
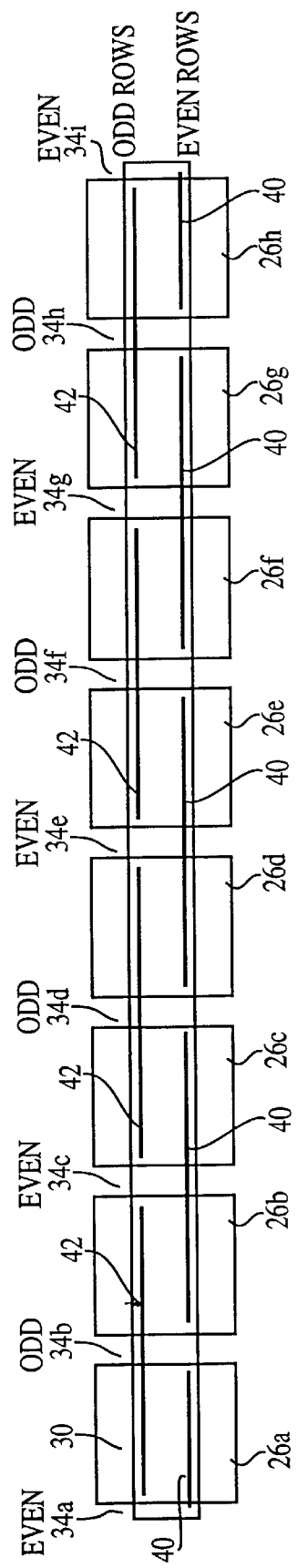
FIG. 3 illustrates a portion of the memory bank from FIG. 2.

The selective disabling of a wordline driver and enabling of a redundant wordline driver according to the present invention is as follows. In accordance with the present invention, a pair of complementary redundant matching signals, RED 58 and RED* 56, are provided from a matching circuit 82. Signal RED 58 is input to a second input of each AND gate 50e–50h. Signal RED* 56 is input to a second input of each AND gate 50a–50d. Matching circuit 82 compares each incoming address to addresses of defective memory cells, typically designated by blown fuse addresses stored in fuse banks (not shown), as is known in the art and described with respect to FIGS. 1 and 2, to determine whether the incoming address matches with one of the blown fuse addresses, i.e., a defective memory cell. If matching circuit 82 determines there is not a match, i.e., the address for the desired memory cell does not match the address of a defective memory cell, it is not necessary to substitute one of the redundant wordlines and the appropriate primary wordline can be activated. The redundant match signal RED 58 output from matching circuit 82 will be low, and accordingly signal RED* 56 will be high. The low input of signal RED 58 to AND gates 50e–50h will cause a low output from AND gates 50*e*–50*h*, regardless of the state of the RPH signals 70–76 being input to AND gates 50*e*–50*h*. The low outputs from AND gates 50*e*–50*h* will effectively disable the redundant wordline drivers 34 by not driving the redundant wordline drivers 34.

Conversely, the high signal RED* 56 output from matching circuit 82 being input to the second input of AND gates 50*a*–50*d* will cause the output of one of the AND gates 50*a*–50*d* to be high, depending on the state of the GPH signals 60–66. Global driver 52 will output a high signal on one phase of signals GPH 60–66, and a high signal on the corresponding signal RPH 70–76, depending on the address of the memory cell selected for access and an address specified by match circuit 82 via line 83, respectively, and a low signal on the other three global and other three redundant phase signals. For example, if the address of the cell for access requires that phase <1> be high, then both GPH<1>62 and, for example, RPH<1>72 will be high, while the remaining phase signals will be low. It should be noted, however, that any one of the redundant phase signals RPH 70–76 could be high depending on which programmed fuse bank matched the incoming address. The high signal GPH<l>62 and the high signal RED* 56 input to AND gate 50*a* will cause a high output from AND gate 50*a*, which, along with the address term on bus line 80, will activate the appropriate wordline driver 34 to drive its associated wordline of a primary row of the 256K blocks 30 associated with that wordline driver 34.

Now suppose, for example, matching circuit 82 determines the address of the cell to be accessed matches a defective address, requiring substitution of a redundant element. Matching circuit 82 will output a high match signal RED 58 and accordingly signal RED* 56 will be low. The low input of signal RED* 56 to AND gates 50*a*–50*d* will cause a low output from AND gates 50*a*–50*d*, regardless of the state of the GPH signals 60–66 being input to AND gates 50*a*–50*d*. The low outputs from AND gates 50*a*–50*d* will effectively disable the wordline drivers 34 for the primary rows of the 256K blocks 30.

Conversely, the high signal RED 58 output from matching circuit 82 being input to the second input of AND gates 50*e*–50*h* will cause the output of one of the AND gates 50*e*–50*h* to be high, depending on the state of the RPH signals 70–76. As noted above, global driver 52 will output a high signal on one phase of signals GPH 60–66, and a high signal on the corresponding signal RPH 70–76, depending on the address of the memory cell selected for access and an address specified by match circuit 82 via line 83, respectively, and a low signal on the other three global and other three redundant phase signals. For example, if the address of the cell for access requires that phase <1> be high, then both GPH<1> 62 and, for example, RPH<1>72 will be high, while the remaining phase signals will be low. It should be noted, however, that any one of the redundant phase signals RPH 70–76 could be high depending on which programmed fuse bank matched the incoming address. The high signal RPH<1>72 and the high signal RED 58 input to AND gate 50*e* will cause a high output from AND gate 50*e*, which, along with the address term on line 80, will activate the appropriate redundant wordline driver 34 to drive its associated redundant wordline of a redundant row of its associated 256K blocks 30, such as for example RWL<0>.

Thus, by utilizing AND gates 50*a*–50*h* in conjunction with the phase signals GPH 60–66 and RPH 70–76, and the redundant matching signals RED 58 and RED* 56, it is possible to disable a wordline driver 34 associated with a defective cell in only a portion of a primary row of 256K block and enable a redundant wordline driver 34 associated with a portion of a redundant row to replace the defective cell.

Figure 5:
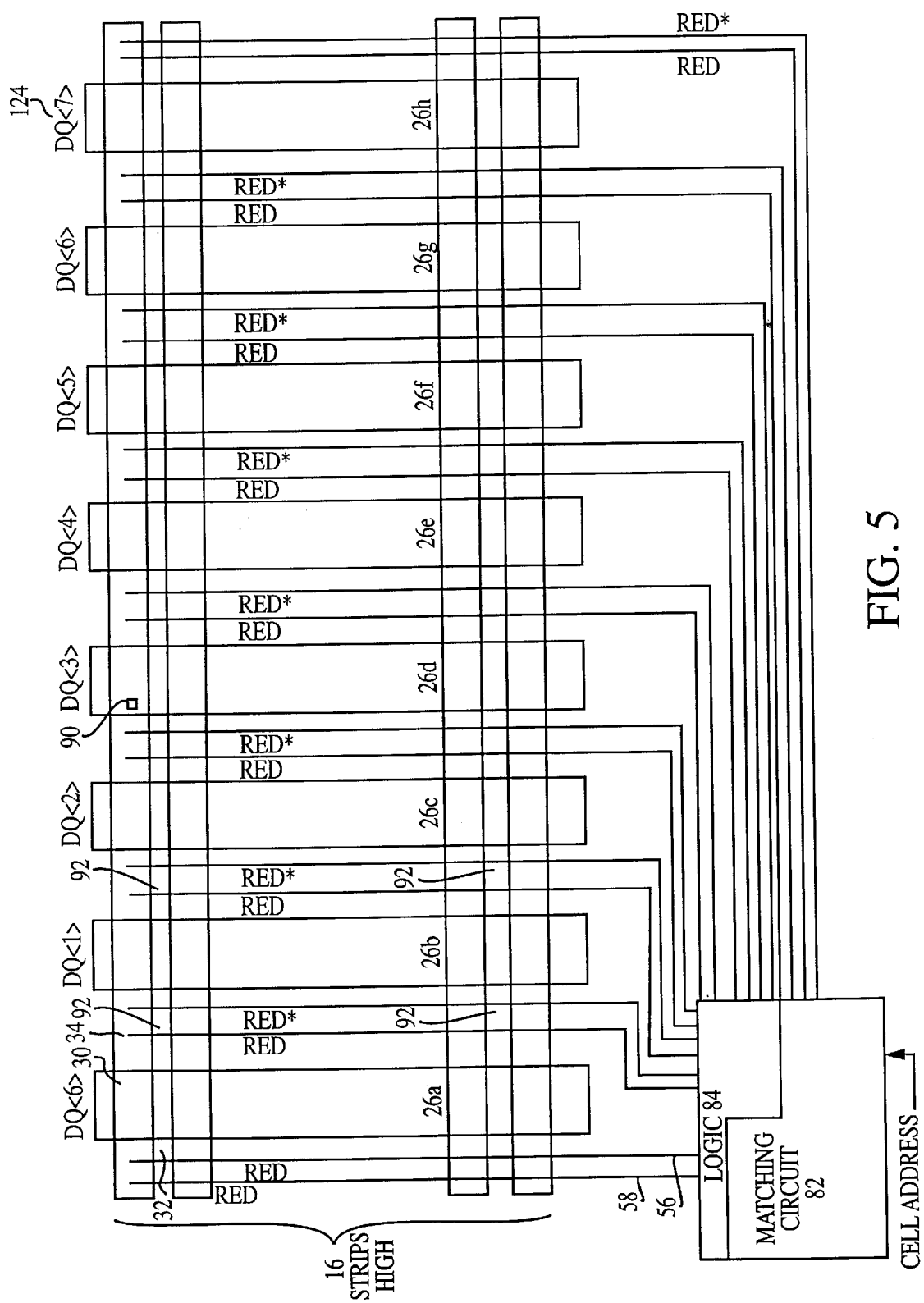
FIG. 5 illustrates a memory bank in accordance with the present invention.

FIG. 5 illustrates how only a portion of a primary row can be selectively disable and replaced with a corresponding portion of a redundant row according to the present invention. FIG. 5 illustrates in block diagram form a 32 Mbit bank 124 in accordance with the present invention. As shown in FIG. 5, matching circuit 82 includes a logic portion 84. Alternatively, the logic portion 84 could be separate from matching circuit 82. The matching signals RED 58 and RED* 56 run between each vertical strip 26*a*–26*h* of the bank 124 and on the outer edge of strips 26*a* and 26*h*. Phase signals GPH 60–66 and RPH 70–76 run between each horizontal strip and on the outer edge of the horizontal strips (not shown in FIG. 5 for clarity). The circuitry illustrated in FIG. 4, including the wordline and redundant wordline drivers 34 and AND gates 50*a*–50*h*, is also provided between each vertical strip 26*a*–26*h* and on the outer edges of strips 26*a* and 26*h*, and in the gap cells 92, i.e., the area of intersection of the wordline drivers 34 and sense amplifiers 32 between each vertical strip 26*a*–26*h* and each horizontal strip. Logic 84 selectively controls the application of the match signals RED 58 and RED* 56 to the vertical strip 26*a*–26*h* based on the address of the cell being accessed.

Suppose for example there is a defective element 90 in an odd row of 256K block 30 located in the first horizontal strip in vertical strip 26*d*. The incoming cell address will be compared with the defective cell addresses, and a match determined. Accordingly, the defective element must be replaced by a redundant element. Matching circuit 82 will provide a high match signal RED 58 and low match signal RED* 56 to logic 84. Logic 84, based on the cell address, will provide these signals only on the signal lines 56, 58 located between vertical strips 26*c* and 26*d* to disable the primary wordline drivers 34 and enable the redundant wordline drivers 34, as described with respect to FIG. 4, for only the 256K blocks 30 in vertical strips 26*c* and 26*d*. The other vertical strips will receive a low match signal RED 58, thereby enabling the worldine drivers 34 associated with the primary rows in the other vertical strips.

Figure 6:
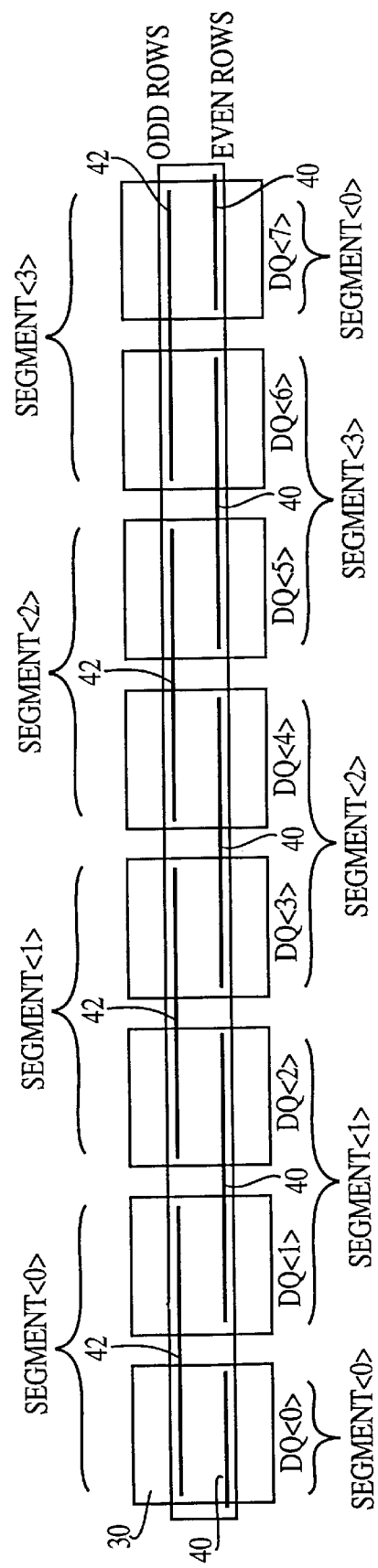
FIG. 6 illustrates the segmentation of the rows in accordance with the present invention.

Accordingly, only a single segment will be replaced by redundant elements. The segmentation of the rows according to the present invention is illustrated in FIG. 6. As shown in FIG. 6, each row across a bank of memory is segmented into four segments, labeled Segment<0> to Segment<3>. For odd rows 42, Segment<0> includes the 256K blocks 30 DQ<0> and DQ<1>, Segment<1> includes the 256K blocks 30 DQ<2> and DQ<3>, Segment<2> includes the 256K blocks 30 DQ<4> and DQ<5>, and Segment<3> includes the 256K blocks 30 DQ<6> and DQ<7>. For the even rows 40, Segment<0> includes the 256K blocks 30 DQ<0> and DQ<7>, Segment<1> includes the 256K blocks 30 DQ<1> and DQ<2>, Segment<2> includes the 256K blocks 30 DQ<3> and DQ<4>, and Segment<3> includes the 256K blocks 30 DQ<5> and DQ<6>.

Thus, when only a single segment, such as for example Segment<1> from the above example which includes the odd rows in vertical strip 26*d* (DQ<3>) is disabled, the remaining segments of the redundant row can still be used to repair additional defective cells within the other 256K blocks 30 within this strip. It should be understood that more than one segment can be repaired within each row, i.e., the logic 84 can provide a high match signal RED 58 to more than one segment if necessary. In the case of a cluster failure, in which several defective elements are located within an area, it is still possible to replace an entire row if necessary utilizing the redundant row across the same horizontal strip or to borrow an entire redundant row from other horizontal strips to replace an entire row, or only a portion of an entire row by selectively applying the high redundancy match signal RED 58 to one or more segments.

Thus, in accordance with the present invention, the rows of a memory bank are segmented into four segments and segmented row repair is provided by selectively disabling a wordline driver for only one segment in which a defective memory cell is located and enabling a redundant wordline driver with a redundant term signal, thereby selecting a redundant row segment for only a specific portion of the entire row length. By selectively disabling only the wordline driver associated with the defective memory cell and dividing the primary and redundant rows into four segments, localized or single bit repair can be performed, thereby efficiently utilizing the redundant rows of the memory device.

Figure 7:
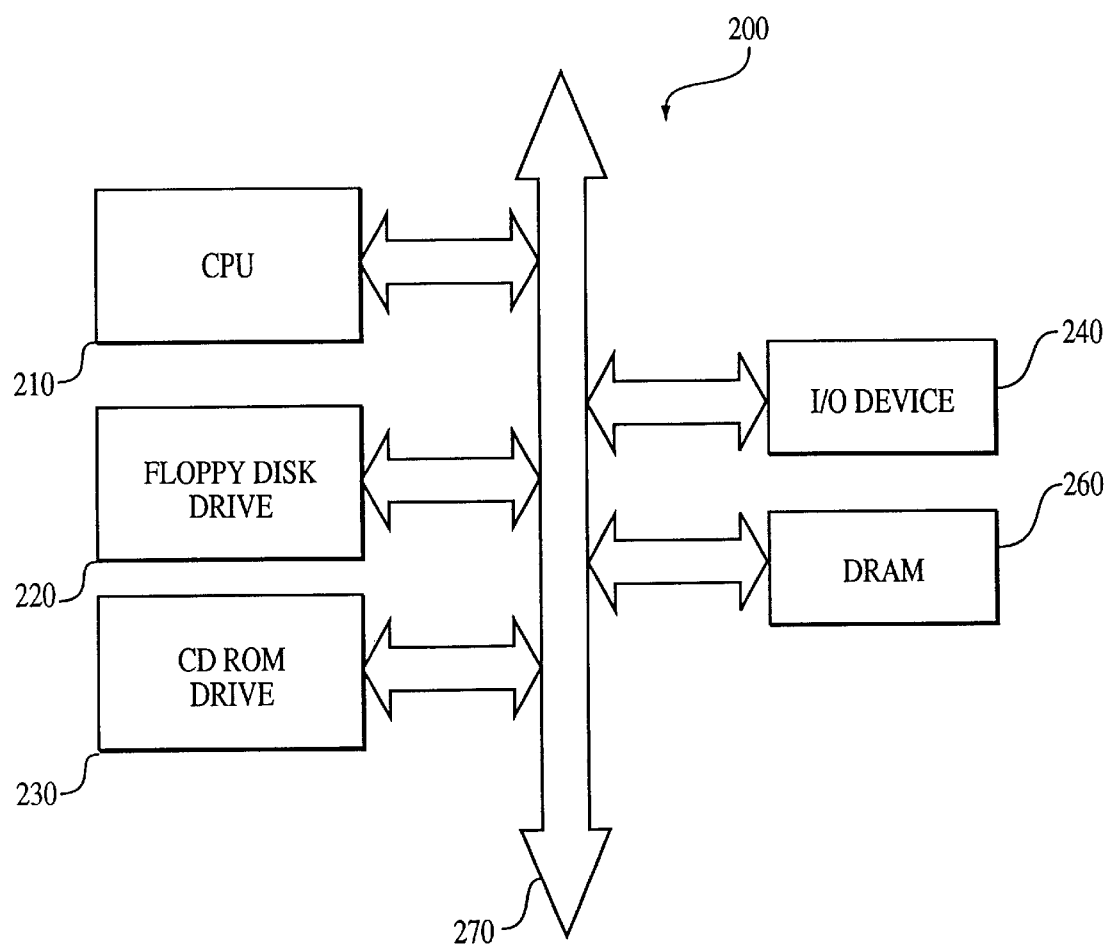
FIG. 7 illustrates in block diagram form a processor system in which a memory device in accordance with the present invention can be used.

A typical processor based system which includes a memory device according to the present invention is illustrated generally at 200 in FIG. 7. A computer system is exemplary of a system having digital circuits which include memory devices. Most conventional computers include memory devices permitting storage of significant amounts of data. The data is accessed during operation of the computers. Other types of dedicated processing systems, e.g., radio systems, television systems, GPS receiver systems, telephones and telephone systems also contain memory devices which can utilize the present invention.

A processor based system, such as a computer system, for example, generally comprises a central processing unit (CPU) 210, for example, a microprocessor, that communicates with one or more input/output (I/O) devices 240 over a bus 270. The computer system 200 also includes random access memory (RAM) such as DRAM 260, and, in the case of a computer system may include peripheral devices such as a floppy disk drive 220 and a compact disk (CD) ROM drive 230 which also communicate with CPU 210 over the bus 270. RAM 260 is preferably constructed as an integrated circuit which includes circuitry to allow for segmented row repair as previously described with respect to FIGS. 4–6. It may also be desirable to integrate the processor 210 and memory 260 on a single IC chip.

It should be noted that while the preferred embodiment of the invention is described as applied to a 256 Mbit memory DRAM device having typical row addressable architecture, the invention is not so limited and may be applied to memory devices having other architectures or sizes as well. Additionally, while the invention has been described with reference to segmenting the rows into four segments, the invention is not so limited and any number of segments can be used.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A memory device comprising:
   a plurality of memory blocks comprising a plurality of rows of primary memory cells and at least one row of redundant memory cells, each block being arranged into a plurality of segments, each segment respectively comprising a portion of a single row of primary memory cells;
   means for comparing an input address of a memory cell to an address of at least one defective memory cell and providing a first control signal if said input address matches said address of said at least one defective memory cell; and
   means for repairing out responsive to said first control signal at least one primary memory cell row with said at least one redundant memory cell row in only said segment in which said at least one defective memory cell is located.

2. The memory device of claim 1, wherein said means for repairing comprises:
   means for disabling said primary memory cell row in only said segment in which said at least one defective memory cell is located; and
   means for enabling said at least one redundant memory cell row in said segment in which said at least one defective memory cell is located.

3. The memory device of claim 1, wherein said plurality of rows of primary memory cell rows and said at least one redundant memory cell row are segmented into a plurality of segments such that each segment corresponds to at least two adjacent row blocks of said memory device.

4. A circuit for repairing out a defective memory cell in a memory device, said circuit comprising:
   means for locating said defective memory cell in said memory device;
   means for identifying a segment of a row of memory blocks in which said defective memory cell is located;
   means for disabling a driver associated with a portion of a primary memory cell row in which said defective memory cell is located in only said identified segment;
   means for enabling a driver associated with a redundant memory cell row in only said identified segment; and
   means for repairing out said defective memory cell with said redundant memory cell row in only said portion of the primary memory cell row located in said identified segment.

5. A memory device comprising:
   a first memory bank including a plurality of memory blocks arranged in horizontal and vertical strips, each of said horizontal strips of memory blocks being divided into a plurality of segments, each of said plurality of memory blocks including a plurality of rows of primary memory cells and at least one row of redundant memory cells, each segment comprising a portion of a single row of primary memory cells; and
   means for selectively disabling a respective driver for a wordline associated with a row of primary memory cells in which a defective memory cell is located in one of said segments and enabling a respective driver for a wordline associated with a row of redundant memory cells to substitute a portion of said row of redundant memory cells for a portion of said row of primary memory cells in only said one segment in which said defective memory cell is located.

6. The memory device of claim 5, wherein at least one of said segments spans at least two adjacent vertical strips of said memory blocks.

7. The memory device of claim 5, wherein said means for selectively disabling comprises a plurality of logic gates, each of said plurality of logic gates having an output coupled to an associated wordline driver, and wherein said respective driver for a wordline associated with a row of primary memory cells is disabled based on said output of one of said plurality of logic gates, and said respective driver for a wordline associated with a row of redundant memory cells is enabled based on said output of another of said plurality of logic gates.

8. The memory device of claim 7, wherein said respective driver for said wordline associated with said row of redundant memory cells is enabled and said respective driver for said wordline associated with said row of primary memory cells in which said defective memory cell is located is disabled is further based on a portion of an address of said defective memory cell.

9. The memory device of claim 7, wherein each of said plurality of logic gates is an AND gate having a first input coupled to one of a plurality of first control signals and a second input coupled to one of a plurality of second control signals.

10. The memory device of claim 9, wherein said plurality of first control signals are respective phase signals.

11. The memory device of claim 9, further comprising a global driver circuit to provide said respective phase signals.

12. The memory device of claim 9, wherein said plurality of second control signals includes a redundant match signal and a signal complementary to said redundant match signal.

13. The memory device according to claim 12, further comprising a means for comparing an input memory cell address to an address of said defective memory cell, and if said input memory cell address matches said address of said defective memory cell, outputting a high signal for said redundant match signal and a low signal for said signal complementary to said redundant match signal.

14. The memory device of claim 5, wherein said means for selectively disabling further selectively disables a respective driver for a wordline associated with a row of primary cells in which a second defective memory cell is located in a second of said segments and enables a respective driver for a wordline associated with a row of redundant memory cells in said second segment to substitute a portion of said row of redundant memory cells in said second segment for said row of primary memory cells in said second segment in which said second defective memory cell is located.

15. A processor system comprising:
a central processing unit; and
a memory device connected to said processing unit to receive data from and supply data to said central processing unit, said memory device comprising:
a plurality of memory blocks comprising a plurality of rows of primary memory cells and at least one row of redundant memory cells, each block being arranged into a plurality of segments, each segment respectively comprising a portion of a single row of primary memory cells,
means for comparing an input address of a memory cell to an address of at least one defective memory cell and providing a first control signal if said input address matches said address of said at least one defective memory cell, and
means for repairing out responsive to said first control signal at least one primary memory cell row with said at least one redundant memory cell row in only said segment in which said at least one defective memory cell is located.

16. The system of claim 15, wherein said means for repairing comprises:
means for disabling said primary memory cell row in only said segment in which said at least one defective memory cell is located; and
means for enabling said at least one redundant memory cell row in said segment in which said at least one defective memory cell is located.

17. The system of claim 15, wherein said plurality of rows of primary memory cell rows and said at least one redundant memory cell row are segmented into a plurality of segments such that each segment corresponds to at least two adjacent row blocks of said memory device.

18. A processor system comprising:
a central processing unit; and
a memory device connected to said processing unit to receive data from and supply data to said central processing unit, said memory device comprising:
a first memory bank including a plurality of memory blocks arranged in horizontal and vertical strips, each of said horizontal strips of memory blocks being divided into a plurality of segments, each of said plurality of memory blocks including a plurality of rows of primary memory cells and at least one row of redundant memory cells, each segment comprising a portion of a single row of primary memory cells; and
means for selectively disabling a respective driver for a wordline associated with a row of primary memory cells in which a defective memory cell is located in one of said segments and enabling a respective driver for a wordline associated with a row of redundant memory cells to substitute a portion of said row of redundant memory cells for a portion of said row of primary memory cells in only said one segment in which said defective memory cell is located.

19. The system of claim 18, wherein at least one of said segments spans at least two adjacent vertical strips of said memory blocks.

20. The system of claim 18, wherein said means for selectively disabling comprises a plurality of logic gates, each of said plurality of logic gates having an output coupled to an associated wordline driver, and wherein said respective driver for a wordline associated with a row of primary memory cells is disabled based on said output of one of said plurality of logic gates, and said respective driver for a wordline associated with a row of redundant memory cells is enabled based on said output of another of said plurality of logic gates.

21. The system of claim 20, wherein said respective driver for said wordline associated with said row of redundant memory cells is enabled and said respective driver for said wordline associated with said row of primary memory cells in which said defective memory cell is located is disabled is further based on a portion of an address of said defective memory cell.

22. The system of claim 20, wherein each of said plurality of logic gates is an AND gate having a first input coupled to one of a plurality of first control signals and a second input coupled to one of a plurality of second control signals.

23. The system of claim 22, wherein said plurality of first control signals are respective phase signals.

24. The system of claim 22 further comprising a global driver circuit to provide said respective phase signals.

25. The system of claim 22, wherein said plurality of second control signals includes a redundant match signal and a signal complementary to said redundant match signal.

26. The system of claim 25 further comprising means for comparing an input memory cell address to an address of said defective memory cell, and if said input memory cell address matches said address of said defective memory cell, outputting a high signal for said redundant match signal and a low signal for said signal complementary to said redundant match signal.

27. The system of claim 18, wherein said means for selectively disabling further selectively disables a respective driver for a wordline associated with a row of primary cells in which a second defective memory cell is located in a second of said segments and enables a respective driver for a wordline associated with a row of redundant memory cells in said second segment to substitute a portion of said row of redundant memory cells in said second segment for said row of primary memory cells in said second segment in which said second defective memory cell is located.

* * * * *

UNITED STATES PATENT AND TRADEMARK OFFICE
CERTIFICATE OF CORRECTION

PATENT NO.     : 6,442,084 B2
DATED          : August 27, 2002
INVENTOR(S)    : Brent Keeth It is certified that error appears in the above-identified patent and that said Letters Patent is hereby corrected as shown below:

<u>Title page,</u>
Item [56], References Cited, replace "Doishi et al." with -- Oishi et al. --

<u>Column 2,</u>
Line 59, replace "the example" with -- the redundant row. For example --.

Signed and Sealed this

Thirty-first Day of December, 2002

JAMES E. ROGAN
*Director of the United States Patent and Trademark Office*